(12) United States Patent
Wilson et al.

(10) Patent No.: US 11,552,597 B2
(45) Date of Patent: Jan. 10, 2023

(54) RADIO FREQUENCY AMPLIFIER IMPLEMENTING AN INPUT BASEBAND ENHANCEMENT CIRCUIT AND A PROCESS OF IMPLEMENTING THE SAME

(71) Applicant: Cree, Inc., Durham, NC (US)

(72) Inventors: Richard Wilson, Morgan Hill, CA (US); Marvin Marbell, Morgan Hill, CA (US); Michael LeFevre, Morgan Hill, CA (US)

(73) Assignee: WOLFSPEED, INC., Durham, NC (US)

( * ) Notice: Subject to any disclaimer, the term of this patent is extended or adjusted under 35 U.S.C. 154(b) by 81 days.

(21) Appl. No.: 16/893,913

(22) Filed: Jun. 5, 2020

(65) Prior Publication Data
US 2021/0384866 A1    Dec. 9, 2021

(51) Int. Cl.
*H03F 3/191*    (2006.01)
*H03F 1/02*    (2006.01)
*H03F 1/32*    (2006.01)
*H03F 1/56*    (2006.01)
*H03F 3/21*    (2006.01)

(52) U.S. Cl.
CPC ......... *H03F 1/0205* (2013.01); *H03F 1/3241* (2013.01); *H03F 1/565* (2013.01); *H03F 3/21* (2013.01); *H03F 2200/222* (2013.01); *H03F 2200/387* (2013.01); *H03F 2200/451* (2013.01); *H03F 2201/3215* (2013.01)

(58) Field of Classification Search
CPC ....................................................... H03F 3/191

USPC .................................................. 330/302, 305
See application file for complete search history.

(56) References Cited

U.S. PATENT DOCUMENTS

| | | | |
|---|---|---|---|
| 7,800,448 B2* | 9/2010 | Blednov | H03F 1/0288 330/295 |
| 10,141,303 B1* | 11/2018 | Canning | H01L 23/49838 |
| 2010/0141168 A1 | 6/2010 | Zhang et al. | |
| 2012/0194272 A1 | 8/2012 | Keshishian | |
| 2016/0344353 A1 | 11/2016 | Watts et al. | |
| 2017/0117856 A1* | 4/2017 | Zhu | H01L 23/66 |
| 2019/0088642 A1 | 3/2019 | Canning et al. | |
| 2019/0165753 A1 | 5/2019 | Arigong et al. | |

OTHER PUBLICATIONS

International Patent Application No. PCT/US2021/034532; Int'l Search Report and the Written Opinion; dated Sep. 8, 2021; 16 pages.

* cited by examiner

*Primary Examiner* — Henry Choe
(74) *Attorney, Agent, or Firm* — BakerHostetler

(57) ABSTRACT

An amplifier includes an input matching network; at least one transistor; an input lead coupled to the at least one transistor; a ground terminal coupled to the transistor; an output lead coupled to the at least one transistor; an output matching circuit coupled to the output lead and to the at least one transistor; and a baseband impedance enhancement circuit having at least one reactive element coupled to the input matching network. The baseband impedance enhancement circuit is configured to reduce resonances of a baseband termination.

24 Claims, 10 Drawing Sheets

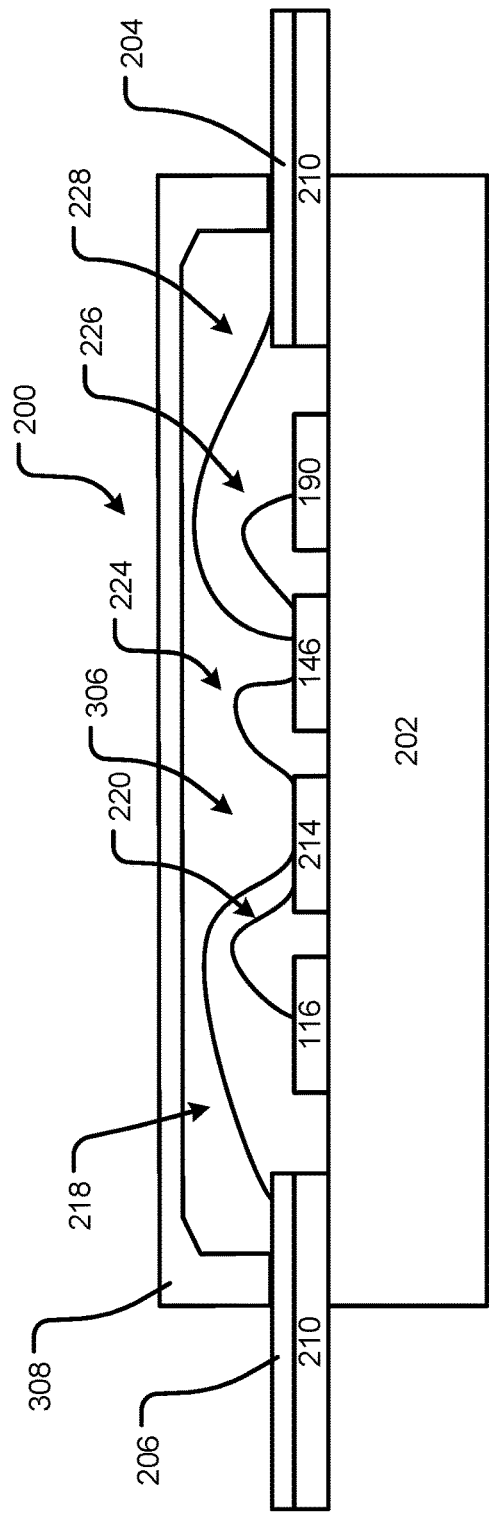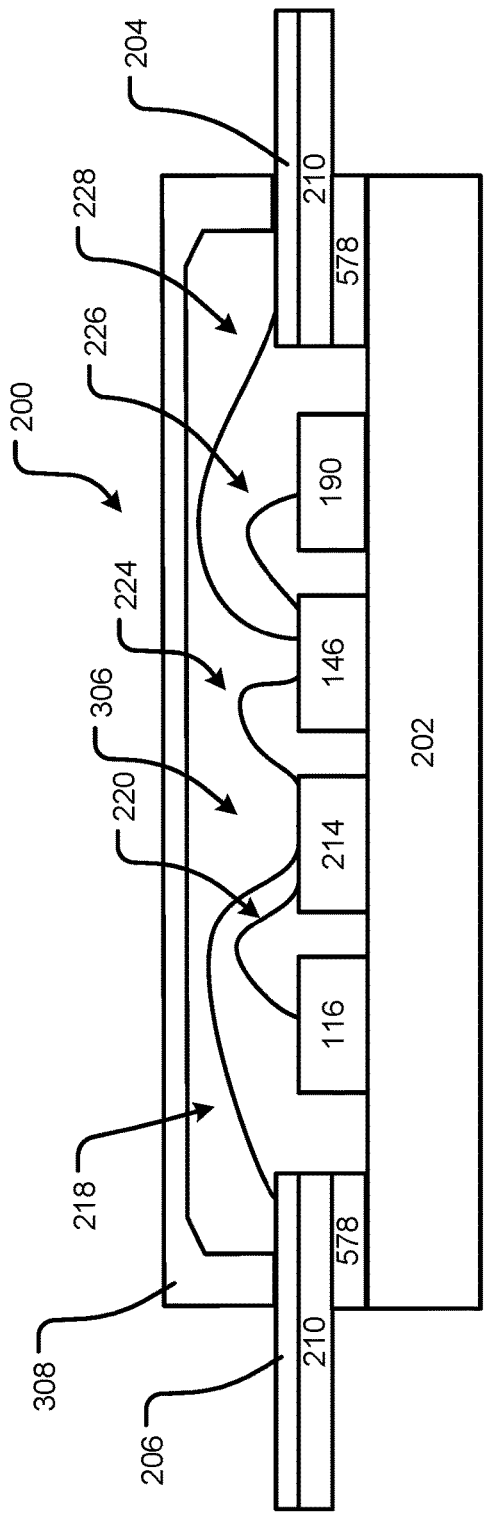
FIG. 7A
FIG. 7B

RADIO FREQUENCY AMPLIFIER IMPLEMENTING AN INPUT BASEBAND ENHANCEMENT CIRCUIT AND A PROCESS OF IMPLEMENTING THE SAME

FIELD OF THE DISCLOSURE

The disclosure relates to a radio frequency amplifier implementing an input baseband enhancement circuit and a process of implementing the same. More specifically, the disclosure relates to a radio frequency amplifier implementing an input baseband enhancement circuit to improve the baseband impedance and a process of implementing the same. Moreover, the disclosure relates to a radio frequency amplifier implementing an input baseband enhancement circuit to improve the baseband impedance and digital predistortion and a process of implementing the same.

BACKGROUND OF THE DISCLOSURE

Radio Frequency (RF) power circuits are used in a variety of applications such as base stations for wireless communication systems and the like. The signals amplified by the RF power circuits often include signals that have a high frequency modulated carrier having frequencies in a 400 megahertz (MHz) to 6 gigahertz (GHz) range. The signals amplified by the RF power circuits often include a baseband signal that modulates a carrier typically at a relatively lower frequency and, depending on the application, can be up to 300 MHz or higher.

The RF power circuits can typically include a transistor die to amplify the RF signal. Examples of transistor dies that are used in RF applications include metal-oxide semiconductor field-effect transistors (MOSFETs), laterally-diffused metal-oxide semiconductor (LDMOS) devices, and high electron mobility transistor (HEMT) devices. These devices typically have relatively low characteristic impedances (for example, 2 ohms or less).

Input and output impedance matching circuits are typically used to match the RF power circuits to external transmission lines that provide RF signals to and from an RF power transistor. These external transmission lines have characteristic impedances that are typically about 50 ohms. However, the characteristic impedances could be any value as determined by a designer, needed for a particular application and/or system, and/or the like.

The input and output matching circuits typically include inductive and capacitive elements that are used to provide impedance matching between the input and output of the RF power transistor. The input and output matching circuits provide impedance matching for the signal frequencies that are amplified by the RF power transistor, such as those in the 400 MHz to 6 GHz range.

The RF power circuit operation can be improved by terminating RF signals as much as possible in the baseband frequency that is below the fundamental frequency and by terminating higher order harmonics of fundamental signals as much as possible that are above the fundamental frequency range. However, the baseband termination of an amplifier can still have resonances that impede the ability of digital predistortion (DPD) operation for linearity across a given band.

Accordingly, there is a need for implementing a RF power amplifier (RFPA) with a baseband impedance enhancement circuit configured to improve baseband impedance, improve digital predistortion (DPD) operation, correct for and/or improve linearity across a given band, and/or other baseband impedance enhancements.

SUMMARY OF THE DISCLOSURE

One aspect includes an amplifier that includes an input matching network; at least one transistor; an input lead coupled to the at least one transistor; a ground terminal coupled to the transistor; an output lead coupled to the at least one transistor; an output matching circuit coupled to the output lead and to the at least one transistor; and a baseband impedance enhancement circuit having at least one reactive element coupled to the input matching network, where the baseband impedance enhancement circuit is configured to reduce resonances of a baseband termination.

One aspect includes a process of implementing an amplifier that includes providing an input matching network; providing at least one transistor; coupling an input lead to the at least one transistor; coupling a ground terminal to the transistor; coupling an output lead to the at least one transistor; coupling an output matching circuit to the output lead and to the at least one transistor; and coupling a baseband impedance enhancement circuit having at least one reactive element to the input matching network, where the baseband impedance enhancement circuit is configured to reduce resonances of a baseband termination.

One aspect includes an amplifier that includes an input matching network; at least one transistor; an input lead coupled to the at least one transistor; a ground terminal coupled to the transistor; an output lead coupled to the at least one transistor; an output matching circuit coupled to the output lead and to the at least one transistor; and a baseband impedance enhancement circuit having at least one reactive element coupled to the input matching network, where the input matching network includes at least one reactive element coupled to the at least one reactive element of the baseband impedance enhancement circuit; and where the baseband impedance enhancement circuit is configured to reduce resonances of a baseband termination.

In this regard, the disclosure adds a circuit, such as an integrated passive device (IPD), to an input side of a device, such as a GaN device, to help improve the baseband impedance of the amplifier for improved digital predistortion (DPD) operation. The baseband termination of an amplifier can have resonances that impede the ability of the DPD to correct for linearity across a given band. Adding the disclosed IPD to the matching topology reduces the resonances and pushes them to higher frequencies thus allowing the DPD to work more effectively over wider bandwidths. Aspects of the disclosure can be used over all bands covered in cellular infrastructure including allowing coverage over multiple bands in the 2 GHz range as well as to cover the full bands where LDMOS devices do not work, such as from 3 GHz to 5 GHz. In particular aspects, the disclosed circuit is configured to operate at an input side of a device, such as a GaN device, a HEMT device, and the like, to improve the baseband impedance of the amplifier over at least a substantial portion of a wideband signal.

Typical devices attempting to achieve wider linearity performance using GaN attempt to improve the performance on an output of the device by adding, for example, larger capacitors to improve the DPD linearity of the device. The disclosure, on the other hand, looks to the input side of the device to make further improvements over existing topologies. Moreover, typical devices may implement circuits to improve baseband impedance in narrowband applications.

However, any such implementation is distinguished from the disclosure that includes aspects of improving the baseband impedance over at least a substantial portion of a wideband signal.

The disclosed implementations show substantial improvements over standard topologies, such as for example, when instantaneous bandwidths are over 160 MHz. Moreover, the disclosure contemplates implementation in wideband technology such as GaN based devices.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 7 includes FIG. 7A that illustrates a cross-sectional view of the package according to one aspect of the disclosure; and FIG. 7 further includes FIG. 7B that illustrates a cross-sectional view of the package according to another aspect of the disclosure.

DETAILED DESCRIPTION OF THE DISCLOSURE

Figure 1:
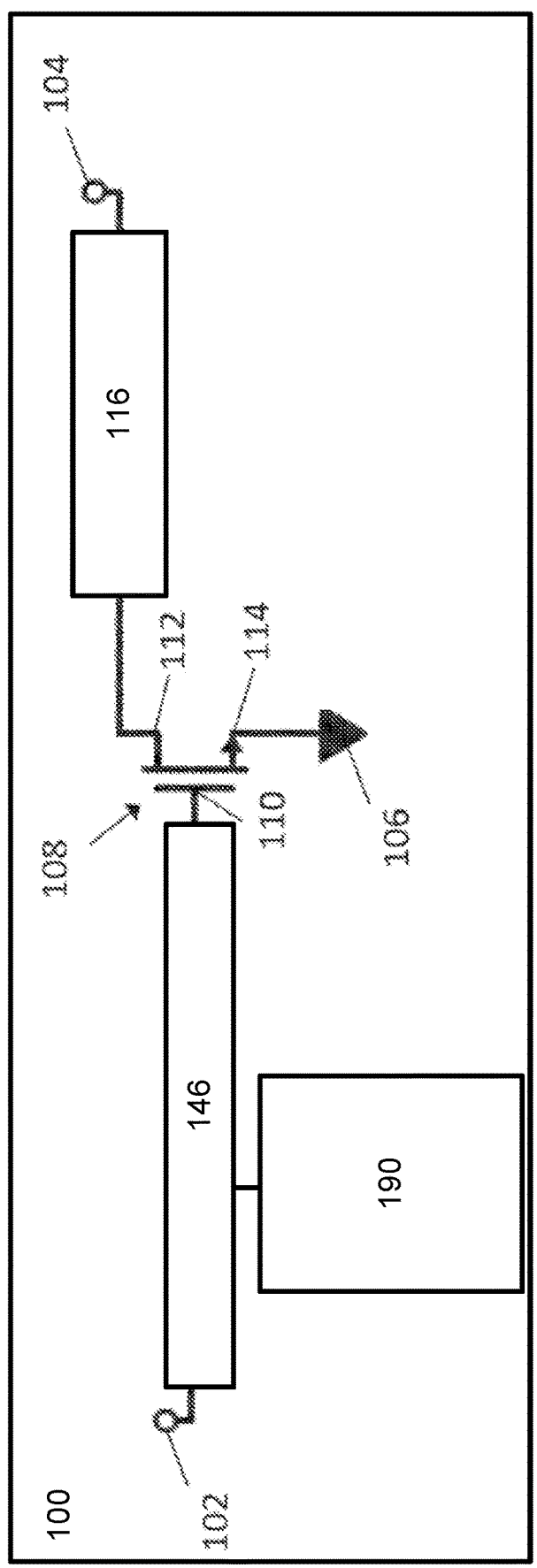
FIG. 1 illustrates a functional block diagram of an RF power amplifier (RFPA) circuit according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a functional block diagram of an RF power amplifier (RFPA) circuit according to the disclosure.

In particular, FIG. 1 illustrates an RF power amplifier (RFPA) circuit 100. The RF power amplifier (RFPA) circuit 100 includes an input port 102, an RF output port 104, and a reference potential port 106. The RF power amplifier (RFPA) circuit 100 additionally includes an RF amplifier device 108 having an input terminal 110 electrically coupled to the input port 102, an output terminal 112 electrically coupled to the RF output port 104, and a reference potential terminal 114 electrically coupled to the reference potential port 106.

In various aspects, the RF amplifier device 108 and the RF power amplifier (RFPA) circuit 100 may be a multi-carrier amplifier, a multiband amplifier, an LTE (long term evolution) compliant amplifier, a WCDMA (wideband code division multiple access) compliant amplifier, an 802.11(x) compliant amplifier, etc. The RF power amplifier (RFPA) circuit 100 may be utilized in or with a base station, a wireless device, a cellular base station communication transmitter, a cellular base station communication amplifier, a RF power amplifier for various cellular bands, a wireless fidelity (Wi-Fi) device, a multiple-input and multiple-output (MIMO) device, a device utilizing IEEE 802.11n (Wi-Fi), device utilizing IEEE 802.11ac (Wi-Fi), a device implementing Evolved High Speed Packet Access (HSPA+) protocol, a device implementing 3G protocol, a device implementing Worldwide Interoperability for Microwave Access (WiMAX) protocol, a device implementing 4G protocol, a device implementing Long Term Evolution (LTE) protocol, a device implementing 5G protocol, a class-A amplifier device, a class-B amplifier device, a class-C amplifier device, a class-AB amplifier device, a Doherty amplifier, and/or the like, and combinations thereof.

Generally speaking, the RF amplifier device 108 may be any device that can perform amplification of an RF signal. In the depicted aspect, the RF amplifier device 108 is a transistor device, wherein the input terminal 110 corresponds to a control terminal or gate terminal of the transistor device, the output terminal 112 corresponds to a first load terminal (e.g., the drain terminal) of the transistor device, and the reference potential terminal 114 corresponds to a second load terminal (e.g., the source terminal) of the transistor device.

The RF amplifier device 108 may be configured to amplify an RF signal across an RF frequency range between the input terminal 110 and the output terminal 112 across an RF frequency range that includes a fundamental RF frequency. According to an aspect, this frequency range may be a "wideband" frequency range. A "wideband" frequency range refers to the fact that the range of frequency values for the RF signal exceeds a coherence bandwidth of a single channel.

The RF power amplifier (RFPA) circuit 100 additionally may include an input impedance matching network 146 connected between the input port 102 of the RF power amplifier (RFPA) circuit 100 and the input terminal 110 of the RF amplifier device 108. A detailed exemplary implementation of the input impedance matching network 146 is described herein with reference to FIG. 2. Additionally, the RF power amplifier (RFPA) circuit 100 may further include an output impedance matching network 116 electrically coupled between the output terminal 112 and the RF output port 104. A detailed exemplary implementation of the output impedance matching network 116 is described herein with reference to FIG. 4.

The RF power amplifier (RFPA) circuit 100 additionally may include a baseband impedance enhancement circuit 190. The baseband impedance enhancement circuit 190 may be connected to the input port 102, the baseband impedance enhancement circuit 190 may be connected to the input impedance matching network 146, the baseband impedance enhancement circuit 190 may be connected to the RF amplifier device 108, and/or the baseband impedance enhancement circuit 190 may be connected to the input terminal 110.

In one or more aspects, the baseband impedance enhancement circuit 190 may connect to the input port 102 upstream from the input impedance matching network 146, the baseband impedance enhancement circuit 190 may connect to the input port 102 downstream of the input impedance matching network 146, or as illustrated in FIG. 1, the baseband impedance enhancement circuit 190 may connect to the input port 102 through the input impedance matching network 146. In one or more aspects, the baseband impedance enhancement circuit 190 may connect to and/or operate on an input side of the RF power amplifier (RFPA) circuit 100. The input side of the RF power amplifier (RFPA) circuit 100 being upstream of the RF amplifier device 108, between the input port 102 and the RF amplifier device 108, between and include the input port 102 and the RF amplifier device 108 and/or the like.

The baseband impedance enhancement circuit 190 may be implemented as an integrated passive device (IPD). The baseband impedance enhancement circuit 190 may be configured to improve the baseband impedance of the RF power amplifier (RFPA) circuit 100. Alternatively or additionally, the baseband impedance enhancement circuit 190 may be configured to provide improved digital predistortion (DPD) operation of the RF power amplifier (RFPA) circuit 100 and/or the RF amplifier device 108. In one aspect, the baseband impedance enhancement circuit 190 may be configured to reduce resonances of a baseband termination. In one aspect, the baseband impedance enhancement circuit 190 may be configured to push and/or move resonances of a baseband termination to higher frequencies.

In one aspect, the baseband impedance enhancement circuit 190 may be configured to push and/or move resonances of a baseband termination to higher frequencies allowing the DPD to work more effectively over wider bandwidths.

In this regard, a baseband termination of the RF power amplifier (RFPA) circuit 100 can have resonances that impede the ability of the DPD operation to correct for linearity across a given band. To implement this correction, implementation of the baseband impedance enhancement circuit 190 to the matching topology of the RF power amplifier (RFPA) circuit 100, such as the input impedance matching network 146, reduces the resonances and pushes the resonances to higher frequencies thus allowing the DPD to work more effectively over wider bandwidths.

The baseband impedance enhancement circuit 190 may be implemented by a network of reactive components. The parameters of the network of reactive components may be specifically tailored to provide a desired frequency response in a given frequency range. More specifically, the parameters of the network of reactive components may be specifically tailored to provide a desired frequency response in a given frequency range in wideband implementations. These reactive components may include one or more inductors and capacitors. The parameters of these inductors and capacitors (i.e., inductance and capacitance) may be specifically tailored to provide a desired frequency response in a given frequency range. More specifically, the parameters of the inductors and capacitors may be specifically tailored to provide a desired frequency response in wideband implementations.

Implementation of the baseband impedance enhancement circuit 190 in the RF power amplifier (RFPA) circuit 100 may be used over all bands covered in cellular infrastructure. Moreover, implementation of the baseband impedance enhancement circuit 190 in the RF power amplifier (RFPA) circuit 100 may include allowing coverage over multiple bands in, for example, the 2 GHz range as well as to also cover the full bands where LDMOS may not work, for example such as from 3 GHz to 5 GHz. Additionally, implementation of the baseband impedance enhancement circuit 190 in the RF power amplifier (RFPA) circuit 100 provides surprising improvements over standard topologies. For example, implementation of the baseband impedance enhancement circuit 190 in the RF power amplifier (RFPA) circuit 100 provides surprising improvements in linearity over standard topologies. Moreover, implementation of the baseband impedance enhancement circuit 190 in the RF power amplifier (RFPA) circuit 100 provides unexpected improvements over standard topologies. In this regard, implementation of the baseband impedance enhancement circuit 190 in the RF power amplifier (RFPA) circuit 100 provides unexpected improvements in linearity over standard topologies. For example, implementation of the baseband impedance enhancement circuit 190 in the RF power amplifier (RFPA) circuit 100 shows improvements over standard topologies, for example, when instantaneous bandwidths are over 160 MHz. Moreover, implementation of the baseband impedance enhancement circuit 190 in the RF power amplifier (RFPA) circuit 100 provides surprising and unexpected improvements for wideband applications.

Figure 2:
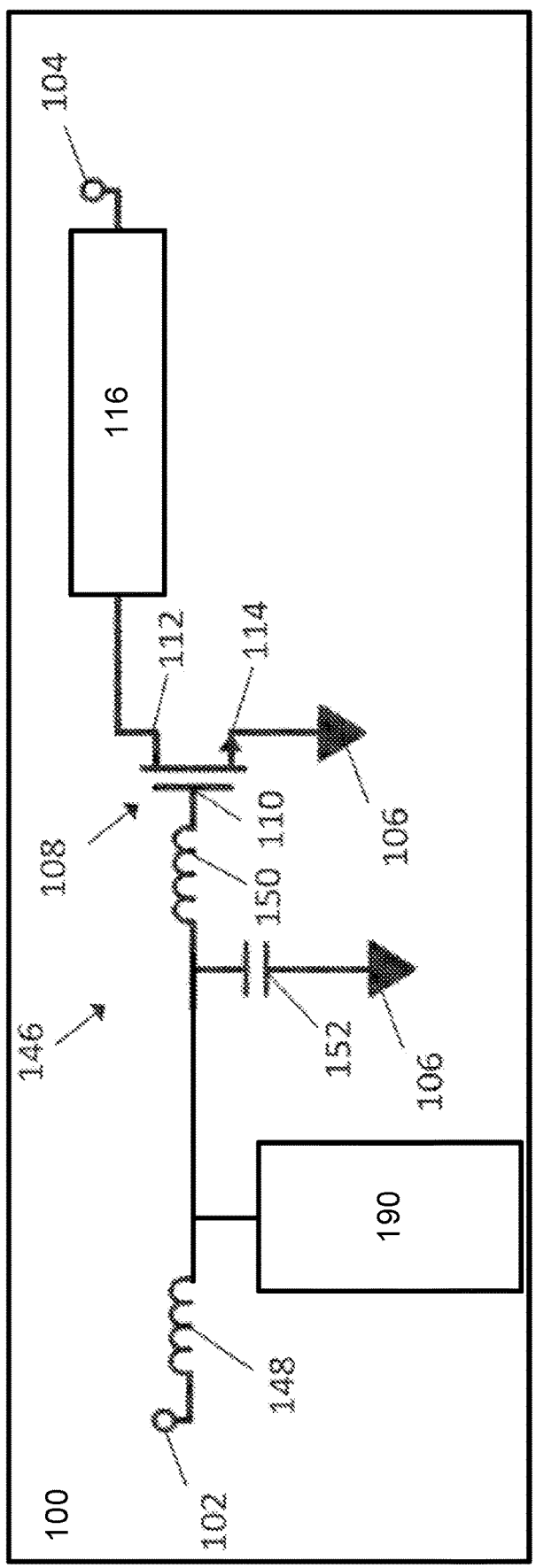
FIG. 2 illustrates further exemplary details of the functional block diagram of an RF power amplifier (RFPA) circuit according to FIG. 1.

FIG. 2 illustrates further exemplary details of the functional block diagram of an RF power amplifier (RFPA) circuit according to FIG. 1.

In particular, FIG. 2 illustrates an exemplary implementation of the input impedance matching network 146. The input impedance matching network 146 may include an inductor 148 and an inductor 150 connected in series between the input port 102 and the input terminal 110 of the RF amplifier device 108. Additionally, the input impedance matching network 146 may include a capacitor 152 connected in parallel with the input terminal 110 of the RF amplifier device 108 and the reference potential terminal 114.

Additionally, FIG. 2 illustrates that the baseband impedance enhancement circuit 190 may be connected between the input port 102 and the input terminal 110. In one aspect, the baseband impedance enhancement circuit 190 may be connected between the inductor 148, the capacitor 152, and/or the inductor 150 of the input impedance matching network 146. In one aspect, the baseband impedance enhancement circuit 190 may be connected downstream from the inductor 148; and the baseband impedance enhancement circuit 190 may be connected upstream from the capacitor 152 and/or the inductor 150 of the input impedance matching network 146. However, as previously noted, the baseband impedance enhancement circuit 190 may be arranged and connected anywhere between the input port 102 and the RF amplifier device 108.

According to one aspect, the parameters of the inductor 150 and the capacitor 152 may be tailored for impedance matching between the input capacitance of the RF amplifier device 108 and a fixed impedance value at the board level (e.g., 50 ohms) in the fundamental frequency range in a similar manner previously discussed. Alternatively, the input impedance matching network 146 can be configured in a number of other circuit configurations.

Figure 3:
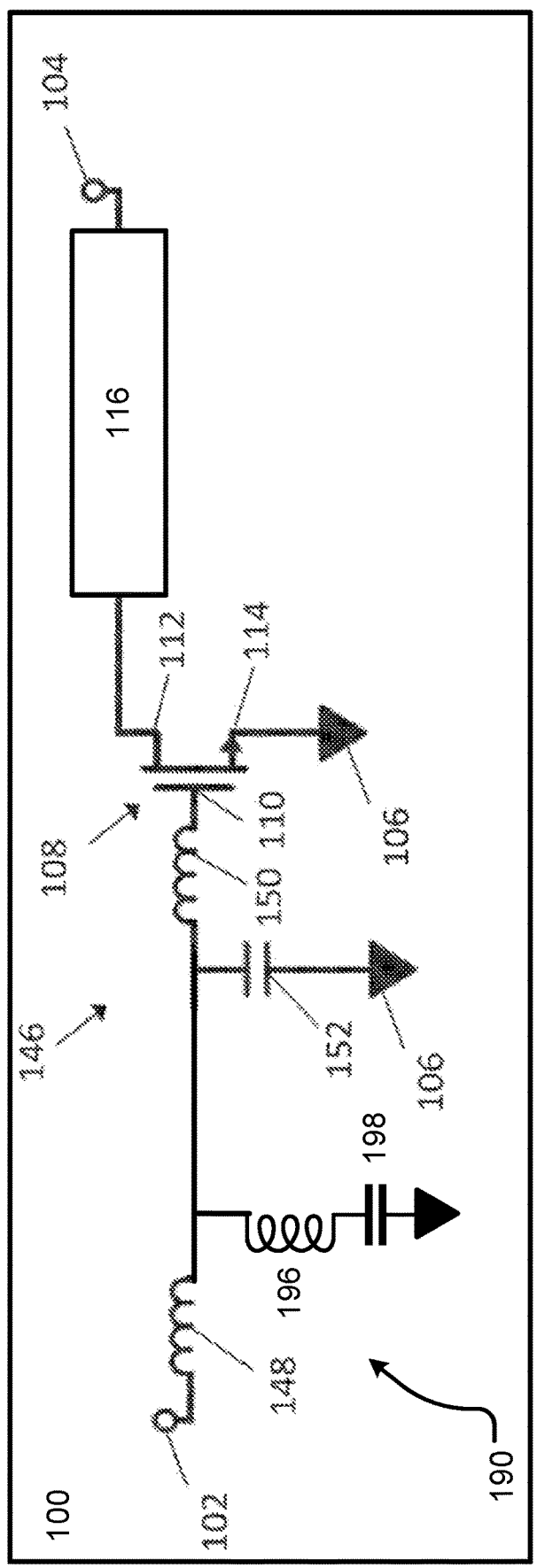
FIG. 3 illustrates further exemplary details of the functional block diagram of an RF power amplifier (RFPA) circuit according to FIG. 1.

FIG. 3 illustrates further exemplary details of the functional block diagram of an RF power amplifier (RFPA) circuit according to FIG. 1.

In particular, FIG. 3 shows further details of the baseband impedance enhancement circuit 190. In one aspect, the baseband impedance enhancement circuit 190 may include an inductor 196 connected between the inductor 148, the capacitor 152, and/or the inductor 150. The inductor 196 may further connect to a capacitor 198. In one aspect, the inductor 196 and the capacitor 198 may be connected in series to a reference potential port 106.

In one aspect, the inductor 196 may be connected to the inductor 148, connected to the capacitor 152, and/or connected to the inductor 150. In one aspect, the inductor 196 may be connected to the inductor 148, connected to the capacitor 152, and connected to the inductor 150. In one aspect, the inductor 196 may be connected to the capacitor 198.

In one aspect, the inductor 196 may be connected directly to the inductor 148, connected directly to the capacitor 152, and/or connected directly to the inductor 150. In one aspect, the inductor 196 may be connected directly to the inductor 148, connected directly to the capacitor 152, and connected directly to the inductor 150. In one aspect, the inductor 196 may be connected directly to the capacitor 198. However, the baseband impedance enhancement circuit 190 may be implemented with similar components providing equivalent circuitry and/or functionality.

The baseband impedance enhancement circuit 190 may be implemented by a network of reactive components. In the depicted aspect, these reactive components include one or more inductors and capacitors. The parameters of these inductors and capacitors (i.e., inductance and capacitance) may be specifically tailored to provide a desired frequency response in a given frequency range. In particular, the parameters of these inductors and capacitors (i.e., inductance and capacitance) may be specifically tailored to improve the baseband impedance of the RF power amplifier (RFPA) circuit 100, to provide improved digital predistortion (DPD) operation of the RF power amplifier (RFPA) circuit 100 and/or the RF amplifier device 108, to reduce resonances of a baseband termination, to push and/or move resonances of a baseband termination to higher frequencies, and/or the like.

Figure 4:
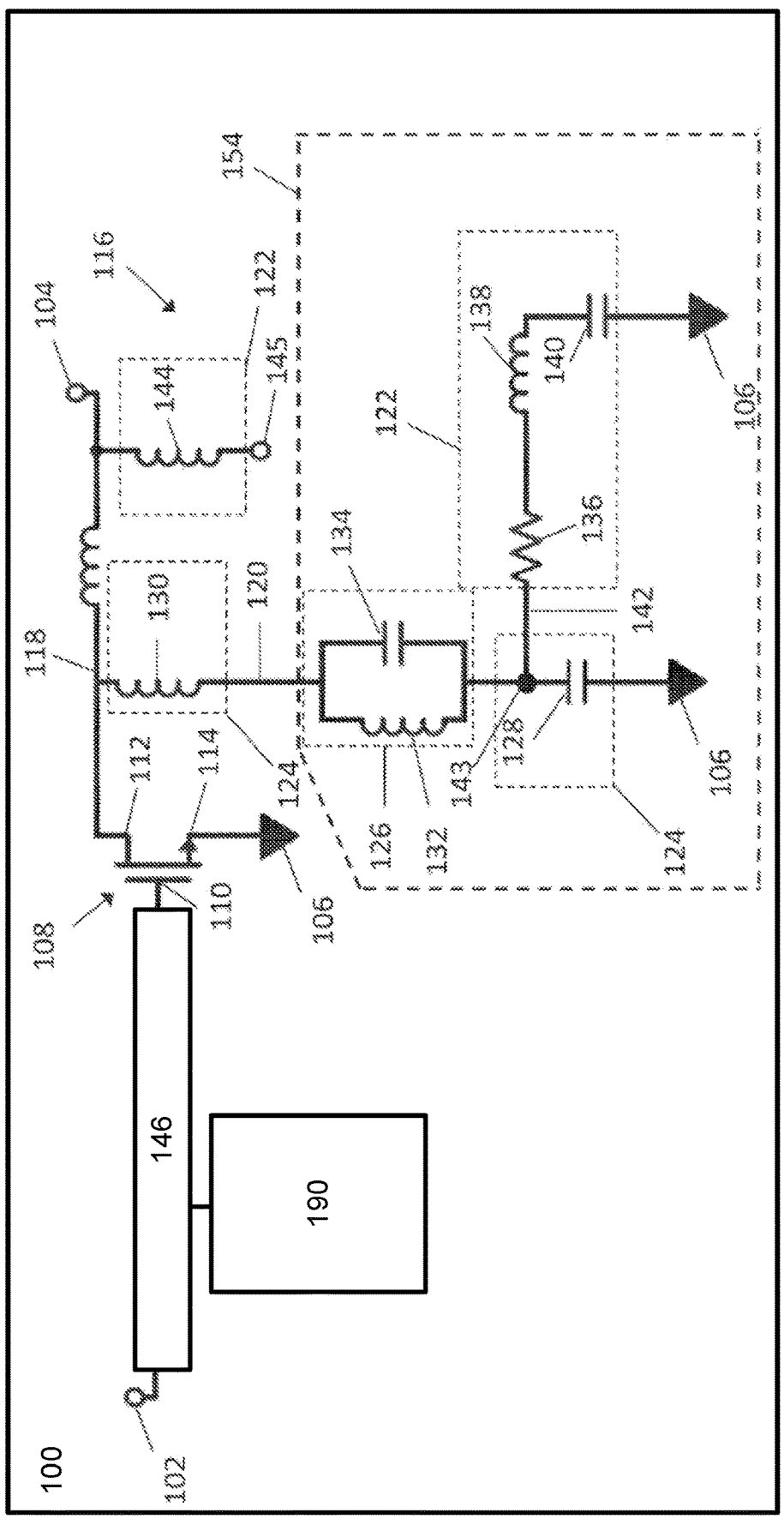
FIG. 4 illustrates further exemplary details of the functional block diagram of an RF power amplifier (RFPA) circuit according to FIG. 1.

FIG. 4 illustrates further exemplary details of the functional block diagram of an RF power amplifier (RFPA) circuit according to FIG. 1.

In particular, FIG. 4 illustrates an exemplary implementation of the output impedance matching network 116. The output impedance matching network 116 may include a series branch 118 that may be connected in series between the output terminal 112 of the RF power amplifier (RFPA) circuit 100 and the RF output port 104 of the RF power amplifier (RFPA) circuit 100 and a parallel branch 120 that is in parallel with the RF output port 104 of the RF power amplifier (RFPA) circuit 100 and the reference potential terminal 114.

The output impedance matching network 116 may include a baseband termination circuit 122, a fundamental frequency matching circuit 124, and a second order harmonic termination circuit 126. The baseband termination circuit 122, the fundamental frequency matching circuit 124, and the second order harmonic termination circuit 126 may each be provided by a network of reactive components. In the depicted aspect, these reactive components include inductors and capacitors. As will be discussed in further detail below, the parameters of these inductors and capacitors (i.e., inductance and capacitance) may be specifically tailored to provide a desired frequency response in a given frequency range. More generally, the reactive components of the output impedance matching network 116 can be provided by any of a variety of components (e.g., radial stubs, transmission lines, etc.) wherein the parameters of these components (e.g., radius, length, etc.) are tailored to provide the desired frequency response.

Figure 5:
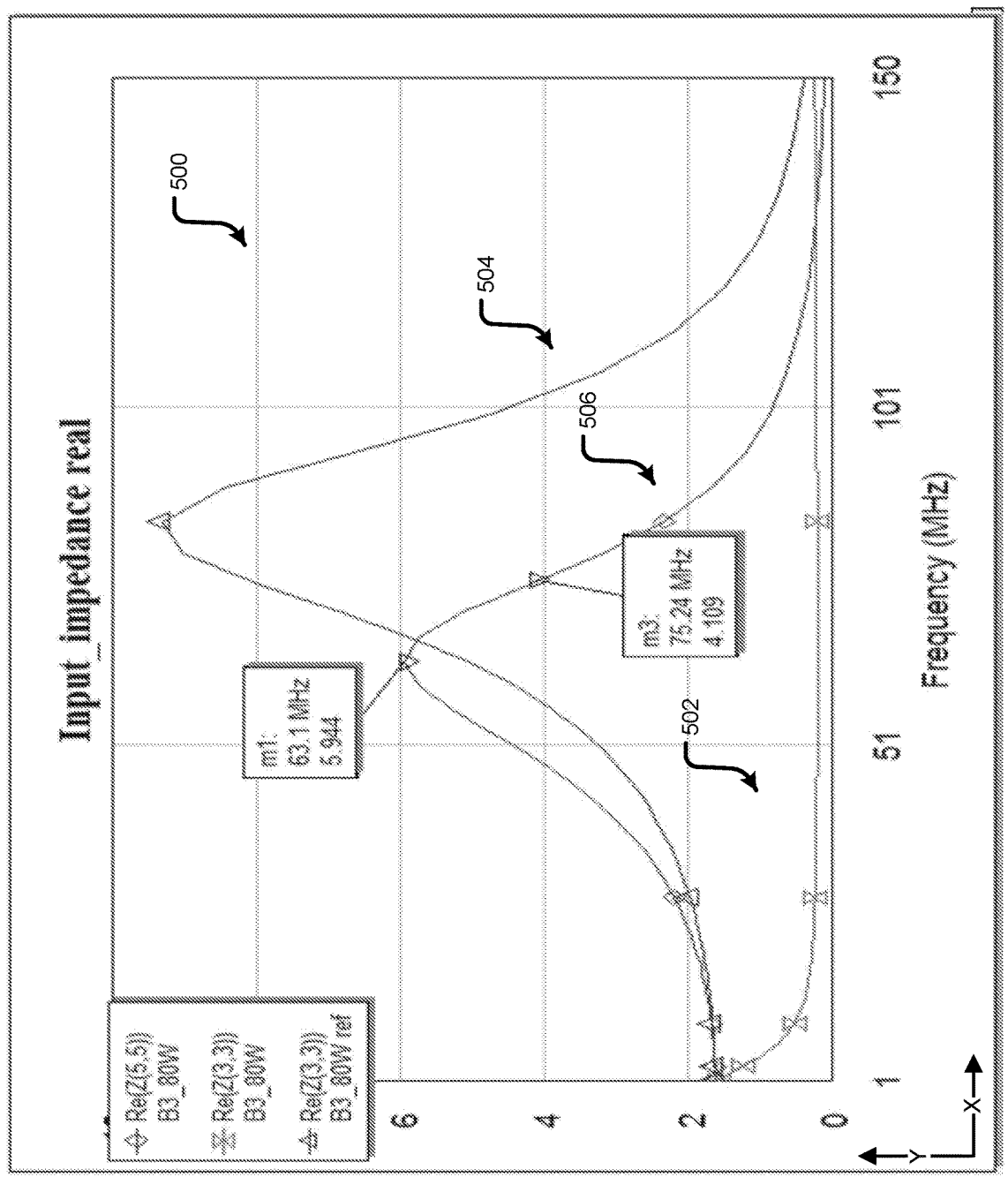
FIG. 5 illustrates a graph of input impedance versus frequency for implementations of an RF power amplifier (RFPA) circuit.

FIG. 5 illustrates a graph of real input impedance versus frequency for implementations of an RF power amplifier (RFPA) circuit.

In particular, FIG. 5 illustrates a graph of real input impedance versus frequency 500 for implementations of an RF power amplifier (RFPA) circuit according to the disclosure 502, a first typical RF power amplifier 504, and a second typical RF power amplifier 506. More specifically, FIG. 5 illustrates a graph of real input impedance versus frequency 500 with input impedance in Ohms along the y-axis and frequency in megahertz along the x-axis.

As noted by FIG. 5, the RF power amplifier (RFPA) circuit according to the disclosure 502 operates with an impedance below two Ohms in at least a frequency range from approximately 1 MHz to at least approximately 150 MHz. Moreover, the impedance of the RF power amplifier (RFPA) circuit according to the disclosure 502 is shown to be highly linear at least in a frequency range from approximately 25 MHz to approximately at least 150 MHz. Moreover, the impedance of the RF power amplifier (RFPA) circuit according to the disclosure 502 is shown to have a slope ($\Delta Y/\Delta X$–first derivative–$dy/dx$) that remains steady, generally constant, and/or unchanged over a substantial portion of a frequency range such as 25 MHz to approximately at least 150 MHz. In particular, the slope staying within 0%-20%, 0%-5%, 5%-10%, 10%-15%, or 15%-20%, over a substantial portion of a frequency range such as 25 MHz to approximately at least 150 MHz. Additionally, it is contemplated that the RF power amplifier (RFPA) circuit according to the disclosure would likewise operate with an impedance below two over additional frequencies above 150 MHz. Moreover, the impedance is contemplated to be highly linear over additional frequencies above 150 MHz.

On the other hand, the first typical RF power amplifier 504 operates with an impedance above two in a frequency range from approximately 25 MHz to at least approximately 110 MHz. Moreover, the impedance is shown to be non-linear over the entire frequency range of the graph.

Likewise, the second typical RF power amplifier 506 operates with an impedance above two in a frequency range from approximately 25 MHz to approximately at least 80 MHz. Moreover, the impedance is shown to be non-linear over the entire frequency range of the graph.

Referring back to FIG. 4, the components of the fundamental frequency matching circuit 124 may be tailored such that the output impedance matching network 116 presents at the output terminal 112 of the RF amplifier device 108 a complex conjugate of an intrinsic impedance of the RF amplifier device 108 in the RF frequency range. As is generally known in the art, optimum power transfer occurs when input and output impedances are matched as complex conjugates of one another. Typically, transistor devices such as GaN based HEMTs have relatively low characteristic input and output impedances (e.g., 2 ohms or less). The fundamental frequency matching circuit 124 matches the output impedance of the RF amplifier device 108 to a fixed value (e.g., 50 ohms), which corresponds to a standardized value at the system level. In this way, optimum power transfer between the RF power amplifier (RFPA) circuit 100 and other components at the system level can be achieved.

According to an aspect, the fundamental frequency matching circuit 124 includes a first capacitor 128 and a first inductor 130. The first capacitor 128 and the first inductor 130 may be connected in series with one another along the parallel branch 120. The inductance of the first inductor 130 may be tailored to provide impedance matching with respect to the characteristic impedance of the RF amplifier device 108. In the depicted circuit, the first inductor 130 may be in parallel with the output of the RF amplifier device 108. Therefore, the output capacitance of the RF amplifier device 108 and the first inductor 130 form a first parallel LC resonator. As is generally known in the art, parallel LC circuits provide maximum impedance (from an RF perspective) at a resonant frequency, i.e., the point at which reactive branch currents are equal and opposite. According to an aspect, the inductance of the first inductor 130 may be tailored such that the first parallel LC resonator resonates at the center frequency of 2.0 GHz. The first capacitor 128 may be configured as a DC blocking capacitor that blocks very low frequencies (e.g., frequencies of less than 10 MHz) and DC signals. Thus, the DC blocking capacitor has a very large capacitance value. Accordingly, at much higher frequency values including the fundamental frequency range, the first capacitor 128 appears as an RF short at the fundamental frequency. In this way, the effects of the first capacitor 128 on the first parallel LC resonator can be disregarded when tailoring the parameters of the first parallel LC resonator.

The components of the second order harmonic termination circuit 126 may be tailored such that the second order harmonic termination circuit 126 presents low impedance at the output terminal 112 of the RF amplifier device 108 in the second order harmonic frequency range. Filtering out higher order harmonic components of the RF signal can substantially improve the efficiency of the device. By mitigating harmonic oscillation at the output of the device, the shapes of the voltage and current waveforms during a transitional state are beneficially controlled for minimal overlap and hence greater efficiency. This is done by including a short circuit path for even higher ordered harmonics (e.g., $2F_0$, $4F_0$, $6F_0$, etc.) of the fundamental frequency $F_0$ of the RF signal being amplified. To this end, the second order harmonic termination circuit 126 may be tailored to provide a short circuit path (from an RF perspective) at the second order harmonic of the fundamental frequency, e.g., 4.0 GHz in the exemplary fundamental frequency range. That is, the second order harmonic termination may be designed to terminate the RF signals in this frequency range such that they do not appear at the RF output port 104.

According to an aspect, the second order harmonic termination circuit 126 may include a second inductor 132 and a second capacitor 134. The second inductor 132 and the second capacitor 134 may be in parallel with one another along the parallel branch 120 of the impedance matching circuit. Thus, the second inductor 132 and the second capacitor 134 may form a second parallel LC resonator. The parameters of the second LC resonator, i.e., the capacitance of the second capacitor 134 and the inductance of the second inductor 132, may be tailored to provide a low impedance path for the second order harmonic between the output terminal 112 of the RF amplifier device 108 and the reference potential terminal 114. This tailoring of the parameters of the second LC resonator accounts for the collective effect of the other reactance values in the output impedance matching network 116, including the first parallel LC resonator that includes the first inductor 130 and the intrinsic capacitance of the RF amplifier device 108. As is generally known, a parallel resonant circuit becomes more capacitive as frequency values increase beyond the resonant frequency and becomes more inductive as frequency values decrease below the resonant frequency. Applying this principle, the resonant frequency of the second parallel LC resonator can be tailored such that the second parallel LC resonator is relatively inductive or capacitive at the second order harmonic so as to compensate for other reactive components in the transmission path between the output terminal 112 of the RF amplifier and the reference potential terminal 114, e.g., the first parallel resonator. That is, the parameters of the second parallel LC resonator can be selected such that the output impedance matching network 116 presents an RF short at the output terminal 112 of the RF amplifier at the second order harmonic of the fundamental frequency, e.g., 4.0 GHz.

The baseband termination circuit 122 may be tailored to present low impedance in the baseband frequency region that is below the RF frequency range. By suppressing these lower frequency values, the effects of inter-modulation-distortion (IMD) across the baseband frequency range can be mitigated, thereby improving the linear efficiency of the RF power amplifier (RFPA) circuit 100. The parameters of the baseband termination circuit 122 (e.g., capacitance and inductance) are selected such that the impedance matching circuit suppresses these lower frequency values. That is, the baseband termination circuit 122 provides a low impedance path (from an RF perspective) from the output terminal 112 of the RF amplifier device 108 to the reference potential terminal 114 for frequencies that lie in this range.

According to an aspect, the baseband termination circuit 122 may include a first resistor 136, a third inductor 138, and a third capacitor 140. Each of these components are connected on a second branch 142 of the output impedance matching network 116. The second branch 142 of the output impedance matching network 116 may be connected between a first node 143 that directly connects the first capacitor 128 to the second parallel LC resonator and the reference potential port. The parameter values of the components in the baseband termination circuit 122 (i.e., resistance, inductance and capacitance) are selected to present low impedance response across a broadband baseband frequency region. Using a baseband frequency range of 400 MHz as an example, the parameters of the third inductor 138 and the third capacitor 140 can be selected such that these components in conjunction with the other components of the impedance matching circuit form a low impedance path from the output terminal 112 of the RF amplifier device 108 to the reference potential terminal 114. By tailoring the resistance of the first resistor 136, the impedance response of the baseband termination circuit 122 is flattened for better performance across the broadband frequency range. That is, the first resistor 136 is used to make the impedance response of the baseband termination circuit 122 less frequency dependent.

Optionally, the output impedance matching network 116 may include a fourth inductor 144 that may be connected between the series branch 118 and a DC terminal 145 of the RF power amplifier (RFPA) circuit 100. The fourth inductor 144 may be configured as an RF choke, i.e., a device that blocks higher frequency values while transmitting lower frequency values. This RF choke can be used in conjunction with the first resistor 136, the third inductor 138, and the third capacitor 140 to present low impedance in the baseband frequency region.

Figure 6:
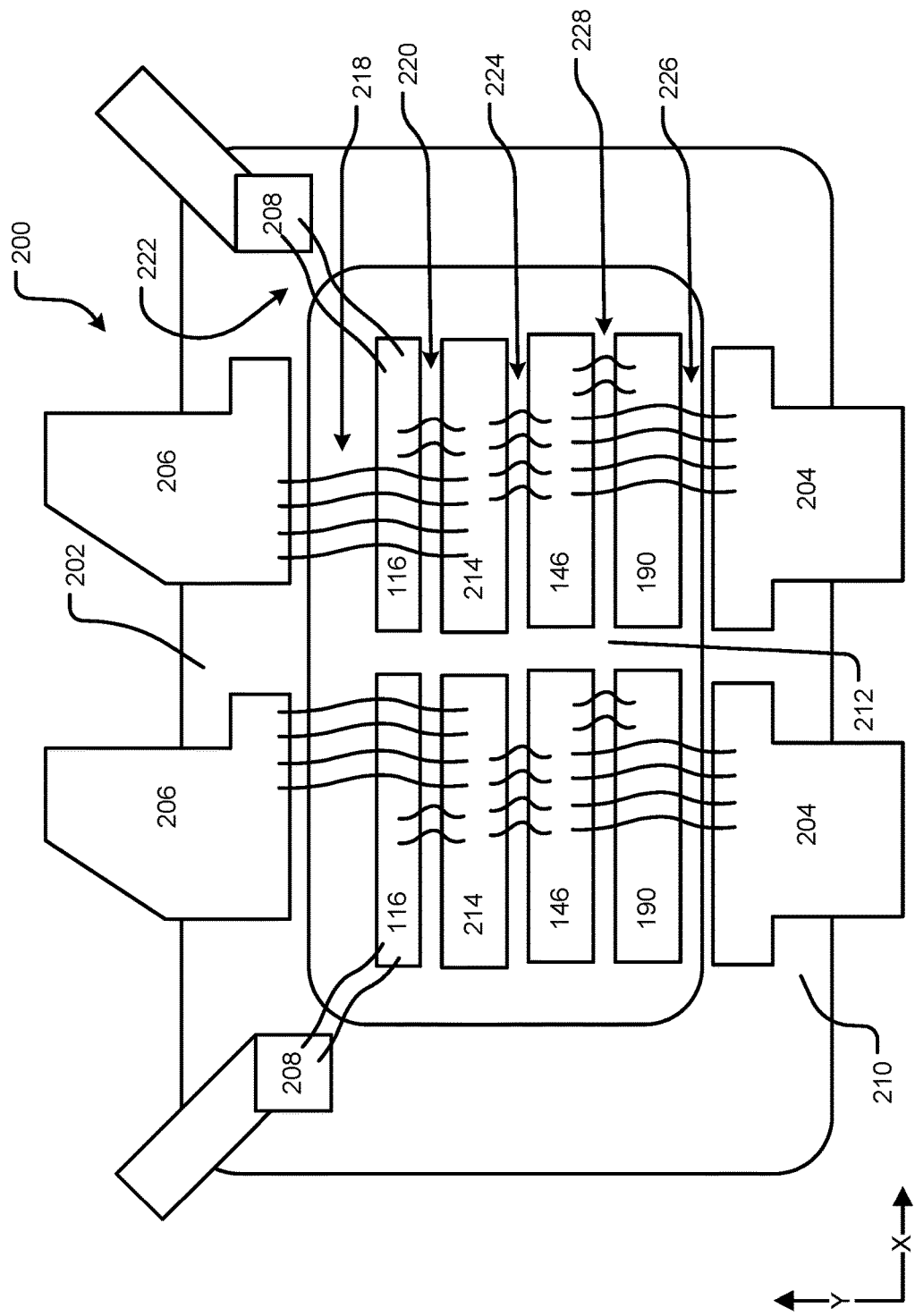
FIG. 6 illustrates a partial top view of a packaged RF power amplifier (RFPA) according to the disclosure.

FIG. 6 illustrates a partial top view of a packaged RF power amplifier (RFPA) according to the disclosure.

FIG. 7 includes FIG. 7A that illustrates a cross-sectional view of the package according to one aspect of the disclosure; and FIG. 7 further includes FIG. 7B that illustrates a cross-sectional view of the package according to another aspect of the disclosure.

Figure 8:
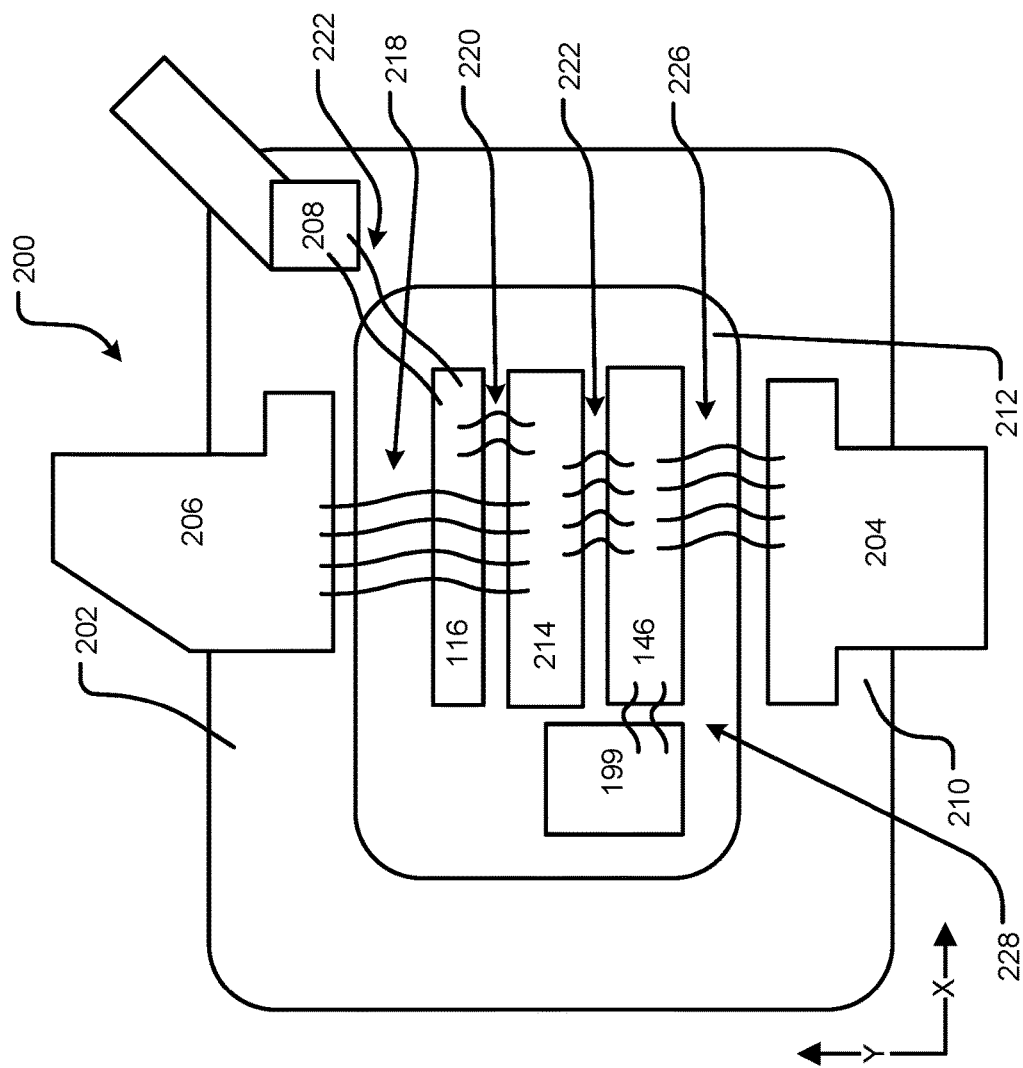
FIG. 8 illustrates a partial top view of a packaged RF power amplifier (RFPA) according to the disclosure.

Referring to FIG. 6 and FIG. 7, a packaged RF amplifier 200 is depicted, according to an aspect. In one aspect as illustrated in FIG. 6, the packaged RF amplifier 200 may contain and/or implement two of the RF power amplifier (RFPA) circuit 100 described herein arranged adjacent to one another. In another aspect as illustrated in FIG. 8, the packaged RF amplifier 200 may contain and/or implement one of the RF power amplifier (RFPA) circuit 100.

The packaged RF amplifier 200 may include a metal flange 202 that may be configured to interface with another device, such as a printed circuit board (PCB) that may utilize printed circuit board (PCB) manufacturing processes. The PCB may be a single layer PCB configuration, a multiple layer PCB configuration, or the like.

The packaged RF amplifier 200 may include a pair of electrically conductive input leads 204 that may extend away from a first side of the metal flange 202, and a pair of electrically conductive output leads 206 that may extend away from a second side of the metal flange 202 in an opposite direction as the electrically conductive input leads 204. The electrically conductive input leads 204 may provide and/or implement the input port 102 of the amplifier circuit 100 as described herein; and the electrically conductive output leads 206 may provide and/or implement the RF output port 104 of the amplifier circuit 100 as described herein. Optionally, the packaged RF amplifier 200 may be implemented to include an independent implementation of the DC bias leads 208 extending away from sides of the packaged RF amplifier 200 adjacent to the electrically conductive output leads 206.

The packaged RF amplifier 200 may be implemented with an electrically insulating window frame 210. The electrically insulating window frame 210 may be formed around a perimeter of the metal flange 202. The electrically insulating window frame 210 may insulate the electrically conductive input leads 204 and the electrically conductive output leads 206 from the metal flange 202. A central portion of the metal flange 202 may be exposed from the insulating window frame 210. This exposed portion of the metal flange 202 may provide an electrically conductive die pad 212 for the mounting of integrated circuit devices thereon. As the metal flange 202 can include a thermally and electrically conductive material (e.g., copper, aluminum, etc.) the electrically conductive die pad 212 may provide both a reference potential connection (e.g., a GND terminal) as well as a heat sink that may be configured to carry heat away from the integrated circuit devices mounted thereon.

The packaged RF amplifier 200 may include RF transistors 214 that are mounted on the metal flange 202. These RF transistors 214 provide and/or implement the RF amplifier device 108 as previously described in the RF power amplifier (RFPA) circuit 100 of FIG. 1. The RF transistors 214 can be configured as power transistors such as a MOSFET (metal-oxide semiconductor field-effect transistor), a DMOS (double-diffused metal-oxide semiconductor) transistor, a GaN HEMT (gallium nitride high electron mobility transistor), a GaN MESFET (gallium nitride metal-semiconductor field-effect transistor), a LDMOS transistor, etc., and more generally any type of RF transistor device.

The RF transistors 214 may include electrically conductive input, output and reference potential terminals. In the depicted aspect, the reference potential terminal is disposed on a bottom side of the RF transistors 214. The reference potential terminal may directly face the die pad 212 and may be electrically connected to the die pad 212, e.g., by a conductive paste. The input and output terminals of the RF transistors 214 may be disposed on a top side of the RF transistor 214 that is opposite the reference potential terminal.

The packaged RF amplifier 200 may include the output impedance matching network 116 as previously described with reference to FIG. 1 connected between the output terminals of the RF transistor and the electrically conductive output leads 206. In one aspect, most of the passive components of the output impedance matching network 116 may be provided by an IPD (integrated passive device). The lower side of the IPD may include a reference potential terminal 114 that may be mounted on the die pad 212 in a similar manner as previously described with reference to the RF transistors 214.

Generally speaking, the term IPD refers to an integrated circuit, which may be semiconductor based, and includes a number of passive devices integrally formed within and connected to the terminals of the IC. A custom circuit topology can be provided by an IPD. A variety of different structures are fabricated within the device to provide the necessary frequency response of a specified passive component (e.g., capacitor, inductor, etc.). Examples of these structures include parallel plate capacitors, radial stubs, transmission lines, etc.

In the depicted aspect, a first set 218 of electrically conductive bond wires may be directly electrically connected between the output terminal of the RF transistor 214 and the electrically conductive output leads 206. A second set 220 of electrically conductive bond wires may be directly electrically connected between the output terminal of the RF transistor 214 and the output impedance matching network 116. A third set 222 of electrically conductive bond wires may be connected directly between the electrically conductive output leads 206 and DC bias leads 208.

A fourth set 226 of bond wires is electrically connected between the electrically conductive input leads 204 and the input impedance matching network 146. A fifth set 228 of bond wires is electrically connected between the input impedance matching network 146 and the input terminals of the baseband impedance enhancement circuit 190. A sixth set 224 of bond wires may electrically connect the input impedance matching network 146 to the RF transistor 214.

The packaged RF amplifier 200 may be implemented to include an open cavity configuration suitable for use with the output impedance matching network 116, the RF transistor 214, the input impedance matching network 146, and/or the baseband impedance enhancement circuit 190 of the disclosure. In particular, the open cavity configuration may utilize an open cavity package design. In some aspects, the open cavity configuration may include a lid 308 or other enclosure for protecting interconnects, circuit components, the output impedance matching network 116, the RF transistor 214, the input impedance matching network 146, the baseband impedance enhancement circuit 190, and/or the like. The packaged RF amplifier 200 may include a ceramic body and/or the lid 308 may be made from a ceramic material. In one aspect, the ceramic material may include aluminum oxide ($Al_2O_3$). In one aspect, the lid 308 may be attached to the electrically insulating window frame 210 with an adhesive. In one aspect, the adhesive may be epoxy based.

Inside the packaged RF amplifier 200, the output impedance matching network 116, the RF transistor 214, the input impedance matching network 146, and/or the baseband impedance enhancement circuit 190 may be attached to the metal flange 202 via a die attach material. The electrically insulating window frame 210 may be configured to isolate a source, a gate, and a drain of the RF transistor 214. The electrically insulating window frame 210 may be configured to be more cost effective, provide better coefficient of thermal expansion (CTE) matching with the metal flange 202, and enable high flexibility in lead configurations for both straight lead and surface mount configurations. The electrically insulating window frame 210 may also be configured to be rigid and therefore more stable and not susceptible to bending.

The metal flange 202 may be made of an electrically conductive material such as copper (Cu), copper-molybdenum, copper laminate structure, Copper-tungsten (CuW), and/or the like and may have a CTE, which closely matches that of the electrically insulating window frame 210. The source side of the RF transistor 214 may be attached to an inner die attach region of the metal flange 202 by an adhesive, soldering, sintering, eutectic bonding, thermal compression bonding, ultrasonic bonding/welding, and/or the like as described herein. In particular, the source side of the RF transistor 214 may be electrically connected to the metal flange 202.

The electrically insulating window frame 210 may include conductive pathways, tracks or signal traces etched from copper sheets laminated, embedded, and/or otherwise attached. The electrically insulating window frame 210 may be attached to an outer peripheral region of the metal flange 202. The electrically insulating window frame 210 may have an opening 306 for receiving the output impedance matching network 116, the RF transistor 214, the input impedance matching network 146, the baseband impedance enhancement circuit 190 and/or the like that may be attached to an inner die attach region of the metal flange 202.

The electrically insulating window frame 210 may have a bottom side which may be attached to the outer peripheral region of the metal flange 202. In one aspect, the electrically insulating window frame 210 may have a bottom side which may be attached to the outer peripheral region utilizing a conductive adhesive. In one aspect, the electrically insulating window frame 210 may have a bottom side which may be attached to the outer peripheral region utilizing an intervening ceramic structure 578 as illustrated in FIG. 7B. In one aspect, the intervening ceramic structure 578 may include a ceramic material such as aluminum oxide ($Al_2O_3$). In one aspect, the intervening ceramic structure 578 may be plated with one or more metals including copper, gold, and the like, and combinations thereof.

The metal flange 202 may dissipate the heat generated by the output impedance matching network 116, the RF transistor 214, the input impedance matching network 146, and/or the baseband impedance enhancement circuit 190. The metal flange 202 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The metal flange 202 may include an insulating material, a dielectric material, and/or the like.

Other implementations of the packaged RF amplifier 200 may include an over-mold configuration. The over-mold configuration may substantially surround the RF transistor 214, which are mounted on the metal flange 202. The over-mold configuration may be formed of a plastic or a plastic polymer compound, which may be injection molded around the metal flange 202, the output impedance matching network 116, the RF transistor 214, the input impedance matching network 146, and/or the baseband impedance enhancement circuit 190 thereby providing protection from the outside environment.

In one aspect, the over-mold configuration may substantially surround the output impedance matching network 116, the RF transistor 214, the input impedance matching network 146, and/or the baseband impedance enhancement circuit 190. The over-mold configuration may be formed of a plastic, a mold compound, a plastic compound, a polymer, a polymer compound, a plastic polymer compound, and/or the like. The over-mold configuration may be injection or compression molded around the output impedance matching network 116, the RF transistor 214, the input impedance matching network 146, the baseband impedance enhancement circuit 190, and/or other components of the packaged RF amplifier 200 from the outside environment.

In particular, the packaged RF amplifier 200 may be implemented at least in part as a Doherty circuit having one of the RF power amplifier (RFPA) circuit 100 implemented as a carrier amplifier and another one of the RF power amplifier (RFPA) circuit 100 implemented as a peaking amplifier. In particular, the packaged RF amplifier 200 may include the carrier amplifier and the peaking amplifier configured such that the packaged RF amplifier 200 power-combines outputs of the carrier amplifier and the peaking amplifier. In one aspect, the two amplifiers may be biased differently. In one aspect, the carrier amplifier may operate at a normal Class AB or Class B. In one aspect, the peaking amplifier may operate at Class C. Other operating classes are contemplated as well.

The packaged RF amplifier 200 may be implemented to include a housing, an open cavity configuration, an over-mold configuration, and/or the like. In this regard, the packaged RF amplifier 200 may be implemented to include a housing. In particular, the housing may include a lid or other enclosure for protecting interconnects, circuit components, and/or the like.

Alternatively, the packaged RF amplifier 200 may be implemented to include an open cavity configuration. In particular, the open cavity configuration may utilize an open cavity package design. In some aspects, the open cavity configuration may include a lid or other enclosure for protecting interconnects, circuit components, and/or the like.

Alternatively, the packaged RF amplifier 200 may be implemented to include an over-mold configuration. In one aspect, the over-mold configuration may substantially surround the components. The over-mold configuration may be formed of a plastic, a mold compound, a plastic compound, a polymer, a polymer compound, a plastic polymer compound, and/or the like. The over-mold configuration may be injection or compression molded around the components, thereby providing protection for the components of the packaged RF amplifier 200 from the outside environment.

FIG. 8 illustrates a partial top view of a packaged RF power amplifier (RFPA) according to the disclosure.

In particular, FIG. 8 illustrates a single implementation of the RF power amplifier (RFPA) circuit 100 and/or the RF transistor 214 in the packaged RF amplifier 200. Additionally, FIG. 8 illustrates the packaged RF amplifier 200 implementing the baseband impedance enhancement circuit 190 off set from the axis (y-axis as referenced in the Figure) from the output impedance matching network 116, the RF transistor 214, the input impedance matching network 146, the electrically conductive output leads 206, and/or the electrically conductive input leads 204. On the other hand, FIG. 6 illustrates the packaged RF amplifier 200 implementing the baseband impedance enhancement circuit 190 along the same axis (y-axis as referenced in the Figure) as the output impedance matching network 116, the RF transistor 214, the input impedance matching network 146, the electrically conductive output leads 206, and/or the electrically conductive input leads 204.

In one or more aspects, the RF transistor 214, the output impedance matching network 116, the input impedance matching network 146, and/or the baseband impedance enhancement circuit 190, may be implemented as an integrated circuit. In particular, each of the RF transistor 214, the output impedance matching network 116, the input impedance matching network 146, and/or the baseband impedance enhancement circuit 190 may be implemented as an active area within the integrated circuit. In one aspect, the RF transistor 214, the output impedance matching network 116, the input impedance matching network 146, and/or the baseband impedance enhancement circuit 190, may be implemented as a monolithic microwave integrated circuit (MMIC).

Figure 9:
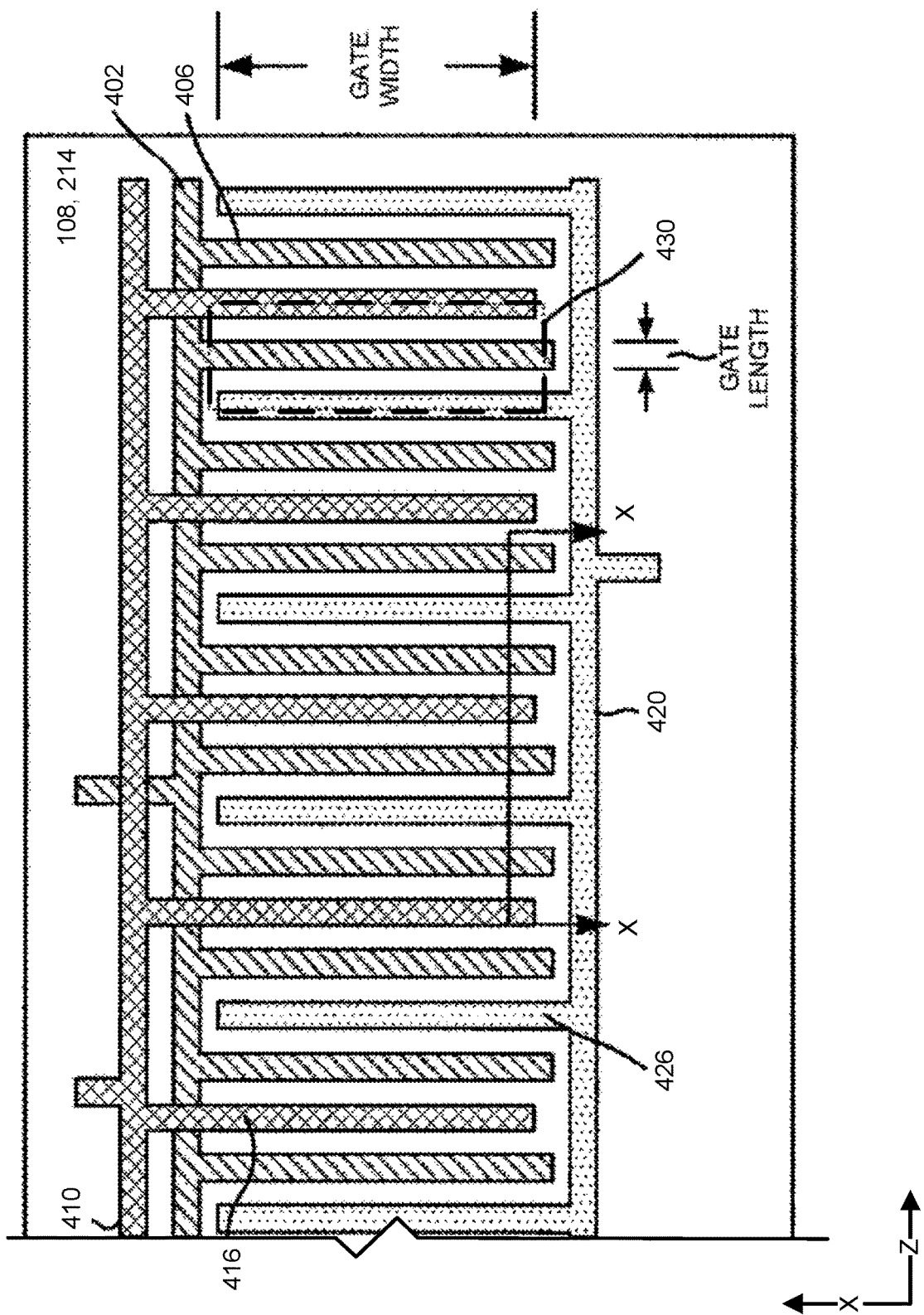
FIG. 9 is an enlarged partial schematic view of a transistor amplifier implementation according to the disclosure.

FIG. 9 is an enlarged partial schematic view of a transistor amplifier implementation according to the disclosure.

Figure 10:
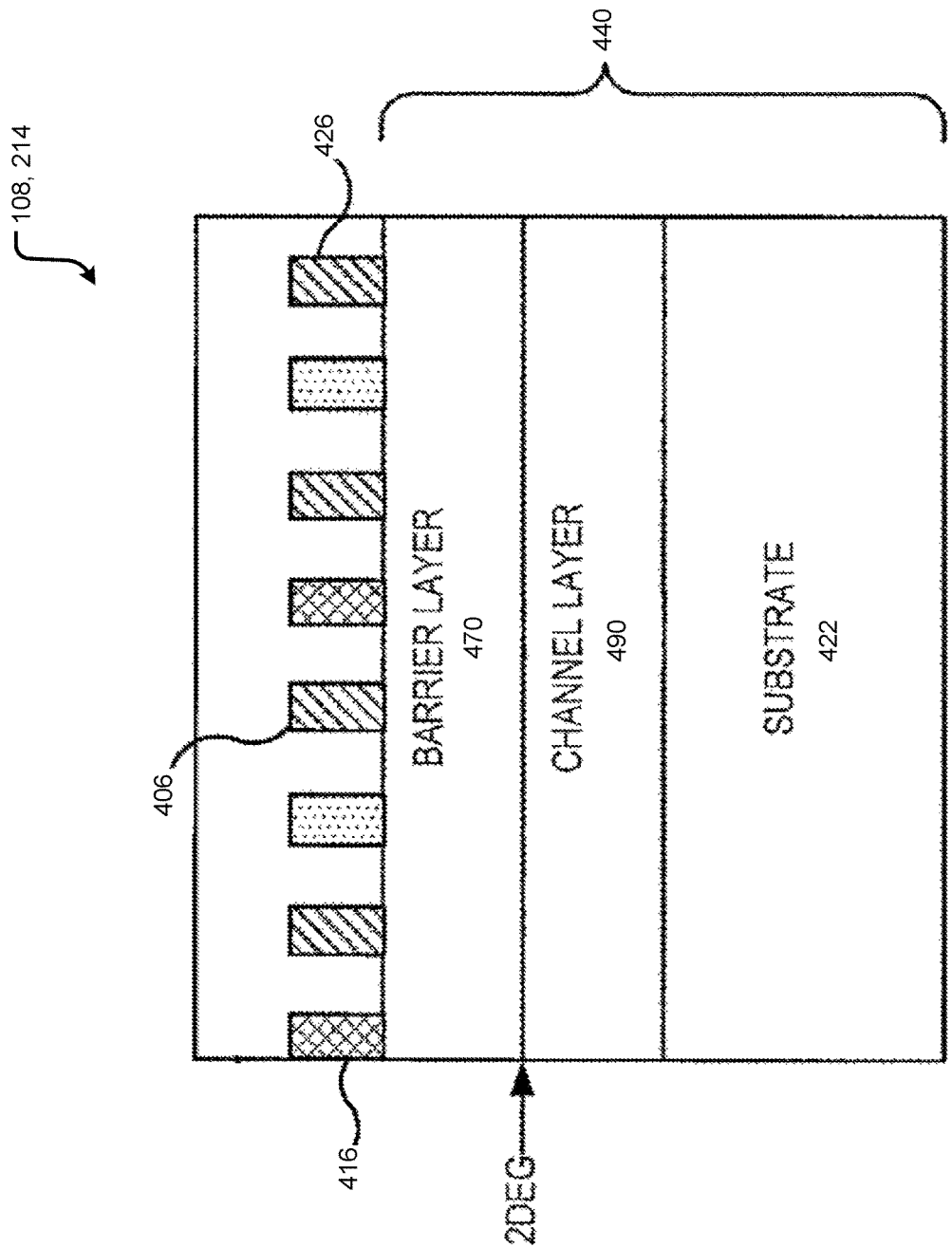
FIG. 10 is a schematic cross-sectional view taken along line XI-XI of FIG. 9.

FIG. 10 is a schematic cross-sectional view taken along line X-X of FIG. 9.

As shown in FIG. 9, the RF amplifier device 108 and/or the RF transistor 214 may include a gate bus 402 that may be connected to a plurality of gate fingers 406 that may extend in parallel in a first direction (e.g., the x-direction indicated in FIG. 9). A source bus 410 may be connected to a plurality of parallel ones of the source contacts 416. The source bus 410 may be connected to a ground voltage node on the underside of the RF amplifier device 108 and/or the RF transistor 214. A drain bus 420 may be connected to a plurality of drain contacts 426.

As can be seen in FIG. 9, each gate finger 406 may run along the X-direction between a pair of adjacent ones of the source contact 416 and drain contact 426. The RF amplifier device 108 or the RF transistor 214 may include a plurality of unit cells 430, where each one of the plurality of unit cells 430 may include an individual transistor. One of the plurality of unit cells 430 is illustrated by the dashed Box in FIG. 9, and includes a gate finger 406 that may extend between adjacent ones of the source contact 416 and the drain contact 426. The "gate width" may refer to the distance by which the gate finger 406 overlaps with its associated one of the source contact 416 and drain contact 426 in the X-direction. That is, "width" of a gate finger 406 refers to the dimension of the gate finger 406 that extends in parallel to the adjacent source contact 416/drain contact 426 (the distance along the z-direction). Each of the plurality of unit cells 430 may share one of the source contact 416 and/or a drain contact 426 with one or more adjacent ones of the plurality of unit cells 430. Although a particular number of the of the plurality of unit cells 430 is illustrated in FIG. 9, it will be appreciated that the RF amplifier device 108 and/or the RF transistor 214 may include more or less of the plurality of unit cells 430.

Referring to FIG. 10, the RF amplifier device 108 and/or the RF transistor 214 may include a semiconductor structure 440 that includes a substrate 422, which may, for example, include 4H—SiC or 6H—SiC. A channel layer 490 may be arranged on the substrate 422, and a barrier layer 470 may be arranged on the channel layer 490 so that the channel layer 490 is between the substrate 422 and the barrier layer 470. The channel layer 490 and the barrier layer 470 may include Group III-nitride based materials, with the material of the barrier layer 470 having a higher bandgap than the material of the channel layer 490. For example, the channel layer 490 may include GaN, while the barrier layer 470 may comprise AlGaN.

Due to the difference in bandgap between the barrier layer 470 and the channel layer 490 and piezoelectric effects at the interface between the barrier layer 470 and the channel layer 490, a two-dimensional electron gas (2DEG) is induced in the channel layer 490 at a junction between the channel layer 490 and the barrier layer 470. The 2DEG acts as a highly conductive layer that allows conduction between the source and drain regions of the device that may be beneath a source contact 416 and a drain contact 426, respectively. The source contact 416 and the drain contact 426 may be on the barrier layer 470. Gate fingers 406 may be on the barrier layer 470 between source contacts 416 and drain contacts 426. While the gate fingers 406 and source contact 416 and drain contacts 426 are all shown as having the same "length" in FIG. 9, it will be appreciated that in practice the gate fingers 406 may have lengths that are substantially smaller than the lengths of the source contacts 416 and drain contacts 426, and it will also be appreciated that the source and drain contacts 426 need not have the same lengths.

The material of the gate finger 406 may be chosen based on the composition of the barrier layer 470. However, in certain embodiments, materials capable of making a Schottky contact to a nitride based semiconductor material may be used, such as Ni, Pt, NiSi$_x$, Cu, Pd, Cr, W and/or WSiN. The source contacts 416 and drain contacts 426 may include a metal, such as TiAlN, that can form an ohmic contact to GaN.

The RF amplifier device 108 and/or the RF transistor 214 may include a metallization layer located on a lower surface of the substrate 422. The metallization layer may be located in a plane generally parallel to the z-axis and/or the x-axis. In one aspect, the metallization layer may be implemented as a full face metallic layer on the lower surface of the substrate 422. The RF amplifier device 108 and/or the RF transistor 214 may include separate conducting lines, tracks, circuit traces, pads for connections, vias to pass connections between layers of aluminum, copper, silver, gold, and/or the like, and features such as solid conductive areas for EM shielding or other purposes.

The RF amplifier device 108 may be implemented as a Field-Effect Transistor (FET), a Metal-Oxide-Semiconductor Field-Effect Transistor (MOSFET), a Laterally Diffused MOSFET (LDMOS), a Gallium Nitride (GaN) MOSFET, a GaN Laterally Diffused MOSFET (LDMOS), a transistor implemented as an amplifier, a GaN High-Electron-Mobility Transistor (HEMT), a GaN metal-semiconductor field-effect transistor (MESFET) transistor, a bipolar transistor, a discrete device, a Doherty arrangement, any device utilizing a bias feed, and the like. Further, more than one the RF amplifier device 108 can be mounted in the RF power amplifier (RFPA) circuit 100 and connected in parallel. In this regard, a plurality of the RF amplifier device 108 may utilize the same type of transistors; and/or a plurality of the RF amplifier device 108 may utilize different types of transistors.

In one aspect, the RF amplifier device 108 may be implemented as a high-power transistor. In one aspect, the RF amplifier device 108 may be implemented as a high-power Laterally Diffused MOSFET (LDMOS), a high-power Gallium Nitride (GaN) MOSFET, a high-power GaN Laterally Diffused MOSFET (LDMOS), a high-power GaN High-Electron-Mobility Transistor (HEMT), and/or a high-power GaN metal-semiconductor field-effect transistor (MESFET) transistor.

In one aspect, the RF amplifier device 108 may be implemented as a high-frequency transistor. In one aspect, the RF amplifier device 108 may be implemented as a high-frequency Laterally Diffused MOSFET (LDMOS), a high-frequency Gallium Nitride (GaN) MOSFET, a high-frequency GaN Laterally Diffused MOSFET (LDMOS), a high-frequency GaN High-Electron-Mobility Transistor (HEMT), and/or a high-frequency GaN metal-semiconductor field-effect transistor (MESFET) transistor.

In one aspect, the RF amplifier device 108 may be implemented as a high-power high-frequency transistor. In one aspect, the RF amplifier device 108 may be implemented as a high-power high-frequency Laterally Diffused MOSFET (LDMOS), a high-power high-frequency Gallium Nitride (GaN) MOSFET, a high-power high-frequency GaN Laterally Diffused MOSFET (LDMOS), a high-power high-frequency GaN High-Electron-Mobility Transistor (HEMT), and/or a high-power high-frequency GaN metal-semiconductor field-effect transistor (MESFET) transistor.

Where high-power is defined as a peak power of 10 W-2 kW, a peak power of 100 W-500 W, a peak power of 500 W-1 kW, a peak power of 1 kW-1.5 kW, or a peak power of 1.5 kW-2 kW; and/or where high-power defined as a peak power of greater than 10 W, a peak power greater than 500 W, a peak power greater than 1 kW, a peak power greater than 1.5 kW, or a peak power greater than 2 kW.

Where high-frequency is defined as a frequency of 0.4 GHz-6 GHz, a frequency of 1.4 GHz-1.6 GHz, a frequency of 1.8 GHz-2.7 GHz, a frequency of 1 GHz-2 GHz, a frequency of 2 GHz-3 GHz, a frequency of 3 GHz-4 GHz, a frequency of 4 GHz-5 GHz, or a frequency of 5 GHz-6 GHz; and/or where high-frequency is defined as a frequency greater than 1.4 GHz, a frequency greater than 1.8 GHz, a frequency greater than 2 GHz, a frequency greater than 3 GHz, a frequency greater than 4 GHz, a frequency greater than 5 GHz, or a frequency less than 6 GHz.

As described herein, the disclosure has set forth an implementation of the RF power amplifier (RFPA) circuit 100 and/or the packaged RF amplifier 200 that includes the baseband impedance enhancement circuit 190. As disclosed herein, the baseband impedance enhancement circuit 190 may be configured to improve the baseband impedance of the RF power amplifier (RFPA) circuit 100. Alternatively or additionally, the baseband impedance enhancement circuit 190 may be configured to provide improved digital predistortion (DPD) operation of the RF power amplifier (RFPA) circuit 100 and/or the RF amplifier device 108. In one aspect, the baseband impedance enhancement circuit 190 may be configured to reduce resonances of a baseband termination. In one aspect, the baseband impedance enhancement circuit 190 may be configured to push and/or move resonances of a baseband termination to higher frequencies.

In particular, connected as described herein may include coupling or connections that may include leads, wire bonding, an adhesive, soldering, sintering, eutectic bonding, thermal compression bonding, ultrasonic bonding/welding, a clip component, and/or the like as described herein. The connection may be through intervening structures or components or the connection may be a direct connection.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a solid mass of material by heat and/or pressure. The sintering process may operate without melting the material to the point of liquefaction. The sintering process may include sintering of metallic powders. The sintering process may include sintering in a vacuum. The sintering process may include sintering with the use of a protective gas.

The eutectic bonding of the disclosure may utilize a bonding process with an intermediate metal layer that may form a eutectic system. The eutectic system may be used between surfaces to be connected. The eutectic bonding may utilize eutectic metals that may be alloys that transform from solid to liquid state, or from liquid to solid state, at a specific composition and temperature without passing a two-phase equilibrium. The eutectic alloys may be deposited by sputtering, dual source evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

Any one or more components of the packaged RF amplifier 200 may be arranged on one or more metallization layers on the electrically insulating window frame 210 and/or the like. The one or more metallization layers may include utilizing one or more manufacturing techniques including print screening for solder past, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

In particular aspects, the RF power amplifier (RFPA) circuit 100 and/or the packaged RF amplifier 200 of the disclosure may be utilized in wireless base stations that connect to a wireless device. In further aspects, the RF power amplifier (RFPA) circuit 100 and/or the packaged RF amplifier 200 of the disclosure may be utilized in amplifiers implemented by wireless base stations that connect to a wireless device. In further aspects, the RF power amplifier (RFPA) circuit 100 and/or the packaged RF amplifier 200 of the disclosure may be utilized in wireless devices. In further aspects, the RF power amplifier (RFPA) circuit 100 and/or the packaged RF amplifier 200 of the disclosure may be utilized in amplifiers implemented in wireless devices.

In this disclosure it is to be understood that reference to a wireless device is intended to encompass electronic devices such as mobile phones, tablet computers, gaming systems, MP3 players, personal computers, PDAs, user equipment (UE), and the like. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network. The wireless device may utilize wireless communication technologies like GSM, CDMA, wireless local loop, Wi-Fi, WiMAX, other wide area network (WAN) technology, 3G technology, 4G technology, 5G technology, LTE technology, and/or the like.

In this disclosure it is to be understood that reference to a wireless base station is intended to cover base transceiver station (BTS), node B devices, Base Station (BS) devices, evolved node B devices, and the like that facilitate wireless communication between wireless devices and a network. The wireless base station and/or the network may utilize wireless communication technologies like GSM, CDMA, wireless local loop, Wi-Fi, WiMAX, other wide area network (WAN) technology, 3G technology, 4G technology, 5G technology, LTE technology, and the like.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An amplifier comprising:
an input matching network;
at least one transistor;
an input lead coupled to the at least one transistor;
a ground terminal coupled to the transistor;
an output lead coupled to the at least one transistor;
an output matching circuit coupled to the output lead and to the at least one transistor; and
a baseband impedance enhancement circuit having at least one reactive element coupled to the input matching network,
wherein the baseband impedance enhancement circuit is configured to reduce resonances of a baseband termination;
wherein the at least one reactive element of the baseband impedance enhancement circuit includes at least one of the following: an inductor, a capacitor, and a reference potential port; and
wherein the input matching network includes reactive elements and the at least one reactive element of the baseband impedance enhancement circuit is coupled between the reactive elements of the input matching network.

2. The amplifier according to claim 1 wherein:
the at least one reactive element of the baseband impedance enhancement circuit includes at least an inductor and a capacitor; and
the baseband impedance enhancement circuit is configured to provide improved digital predistortion (DPD) operation.

3. An amplifier comprising:
an input matching network;
at least one transistor;
an input lead coupled to the at least one transistor;
a ground terminal coupled to the transistor;
an output lead coupled to the at least one transistor;
an output matching circuit coupled to the output lead and to the at least one transistor; and
a baseband impedance enhancement circuit having at least one reactive element coupled to the input matching network,
wherein:
the baseband impedance enhancement circuit is configured to reduce resonances of a baseband termination;
the at least one reactive element of the baseband impedance enhancement circuit includes an inductor, a capacitor, and a reference potential port;
the input matching network includes reactive elements and the at least one reactive element of the baseband impedance enhancement circuit is coupled between the reactive elements of the input matching network; and
the baseband impedance enhancement circuit is configured to improve a baseband impedance.

4. The amplifier according to claim 1 wherein:
the baseband impedance enhancement circuit is configured to push and/or move resonances of a baseband termination to higher frequencies.

5. An amplifier comprising:
an input matching network;
at least one transistor;
an input lead coupled to the at least one transistor;
a ground terminal coupled to the transistor;
an output lead coupled to the at least one transistor;
an output matching circuit coupled to the output lead and to the at least one transistor; and
a baseband impedance enhancement circuit having at least one reactive element coupled to the input matching network,
wherein:
the baseband impedance enhancement circuit is configured to reduce resonances of a baseband termination;
the input matching network includes at least one reactive element coupled to the at least one reactive element of the baseband impedance enhancement circuit; and
the amplifier implementing the baseband impedance enhancement circuit is configured to operate with an impedance below two Ohms in at least a frequency range from at least 1 MHz to 150 MHz.

6. The amplifier according to claim 1 wherein the at least one transistor comprises a GaN based transistor.

7. The amplifier according to claim 1 wherein the at least one transistor comprises a LDMOS based transistor.

8. The amplifier according to claim 1 wherein:
the at least one transistor comprises a transistor implemented as a carrier amplifier; and
the at least one transistor comprises a transistor implemented as a peaking amplifier.

9. The amplifier according to claim 1 further comprising:
a metal flange, a first electrically conductive lead, a second electrically conductive lead, and an electrically conductive die pad.

10. A process of implementing an amplifier comprising:
providing an input matching network;
providing at least one transistor;
coupling an input lead to the at least one transistor;
coupling a ground terminal to the transistor;
coupling an output lead to the at least one transistor;
coupling an output matching circuit to the output lead and to the at least one transistor; and
coupling a baseband impedance enhancement circuit having at least one reactive element to the input matching network,
wherein the baseband impedance enhancement circuit is configured to reduce resonances of a baseband termination;
wherein the at least one reactive element of the baseband impedance enhancement circuit includes at least one of the following: an inductor, a capacitor, and a reference potential port; and
wherein the input matching network includes reactive elements and the at least one reactive element of the baseband impedance enhancement circuit is coupled between the reactive elements of the input matching network.

11. The process of implementing an amplifier according to claim 10 wherein:
the at least one reactive element of the baseband impedance enhancement circuit includes at least an inductor and a capacitor; and
the baseband impedance enhancement circuit is configured to provide improved digital predistortion (DPD) operation.

12. A process of implementing an amplifier comprising:
providing an input matching network;
providing at least one transistor;
coupling an input lead to the at least one transistor;
coupling a ground terminal to the transistor;
coupling an output lead to the at least one transistor;
coupling an output matching circuit to the output lead and to the at least one transistor; and
coupling a baseband impedance enhancement circuit having at least one reactive element to the input matching network,
wherein:
the baseband impedance enhancement circuit is configured to reduce resonances of a baseband termination;
the at least one reactive element of the baseband impedance enhancement circuit includes an inductor, a capacitor, and a reference potential port;
the input matching network includes reactive elements and the at least one reactive element of the baseband impedance enhancement circuit is coupled between the reactive elements of the input matching network; and
the baseband impedance enhancement circuit is configured to improve a baseband impedance.

13. The process of implementing an amplifier according to claim 10 wherein:
the baseband impedance enhancement circuit is configured to push and/or move resonances of a baseband termination to higher frequencies.

14. A process of implementing an amplifier comprising:
providing an input matching network;
providing at least one transistor;
coupling an input lead to the at least one transistor;

coupling a ground terminal to the transistor;
coupling an output lead to the at least one transistor;
coupling an output matching circuit to the output lead and to the at least one transistor; and
coupling a baseband impedance enhancement circuit having at least one reactive element to the input matching network,
wherein:
the baseband impedance enhancement circuit is configured to reduce resonances of a baseband termination;
the input matching network includes at least one reactive element coupled to the at least one reactive element of the baseband impedance enhancement circuit; and
the amplifier implementing the baseband impedance enhancement circuit is configured to operate with an impedance below two Ohms in at least a frequency range from at least 1 MHz to 150 MHz.

15. The process of implementing an amplifier according to claim 10 wherein:
the at least one transistor comprises a GaN based transistor; and
the baseband impedance enhancement circuit is configured to improve a baseband impedance.

16. The process of implementing an amplifier according to claim 10 wherein the at least one transistor comprises a LDMOS based transistor.

17. The process of implementing an amplifier according to claim 10 further comprising:
implementing the at least one transistor comprises implementing a transistor as a carrier amplifier; and
implementing the at least one transistor comprises implementing a transistor as a peaking amplifier.

18. An amplifier comprising:
an input matching network;
at least one transistor;
an input lead coupled to the at least one transistor;
a ground terminal coupled to the transistor;
an output lead coupled to the at least one transistor;
an output matching circuit coupled to the output lead and to the at least one transistor; and
a baseband impedance enhancement circuit having at least one reactive element coupled to the input matching network,
wherein the input matching network includes at least one reactive element coupled to the at least one reactive element of the baseband impedance enhancement circuit; and
wherein the baseband impedance enhancement circuit is configured to reduce resonances of a baseband termination;
wherein the at least one reactive element of the baseband impedance enhancement circuit includes at least one of the following: an inductor, a capacitor, and a reference potential port;
wherein the input matching network includes reactive elements and the at least one reactive element of the baseband impedance enhancement circuit is coupled between the reactive elements of the input matching network; and
wherein the baseband impedance enhancement circuit is configured to provide improved digital predistortion (DPD) operation.

19. An amplifier comprising:
an input matching network;
at least one transistor;
an input lead coupled to the at least one transistor;
a ground terminal coupled to the transistor;
an output lead coupled to the at least one transistor;
an output matching circuit coupled to the output lead and to the at least one transistor; and
a baseband impedance enhancement circuit having at least one reactive element coupled to the input matching network,
wherein:
the input matching network includes at least one reactive element coupled to the at least one reactive element of the baseband impedance enhancement circuit; and
the baseband impedance enhancement circuit is configured to reduce resonances of a baseband termination;
the at least one reactive element of the baseband impedance enhancement circuit includes an inductor, a capacitor, and a reference potential port;
the baseband impedance enhancement circuit is configured to improve a baseband impedance; and
the amplifier implementing the baseband impedance enhancement circuit is configured to operate with an impedance below two Ohms in at least a frequency range from at least 1 MHz to 150 MHz.

20. An amplifier comprising:
an input matching network;
at least one transistor;
an input lead coupled to the at least one transistor;
a ground terminal coupled to the transistor;
an output lead coupled to the at least one transistor;
an output matching circuit coupled to the output lead and to the at least one transistor; and
a baseband impedance enhancement circuit having at least one reactive element coupled to the input matching network,
wherein:
the input matching network includes at least one reactive element coupled to the at least one reactive element of the baseband impedance enhancement circuit; and
the baseband impedance enhancement circuit is configured to reduce resonances of a baseband termination;
the at least one reactive element of the baseband impedance enhancement circuit includes at least one of the following: an inductor, a capacitor, and a reference potential port;
the input matching network includes reactive elements and the at least one reactive element of the baseband impedance enhancement circuit is coupled between the reactive elements of the input matching network; and
the baseband impedance enhancement circuit is configured to push and/or move resonances of a baseband termination to higher frequencies.

21. The amplifier according to claim 18 wherein the at least one transistor comprises a GaN based transistor.

22. The amplifier according to claim 18 wherein the at least one transistor comprises a LDMOS based transistor.

23. The amplifier according to claim 18 wherein:
the at least one transistor comprises a transistor implemented as a carrier amplifier; and
the at least one transistor comprises a transistor implemented as a peaking amplifier.

24. The amplifier according to claim 18 further comprising:
a metal flange, a first electrically conductive lead, a second electrically conductive lead, and an electrically conductive die pad.

* * * * *